US010121968B2

(12) United States Patent
Li et al.

(10) Patent No.: US 10,121,968 B2
(45) Date of Patent: Nov. 6, 2018

(54) DECOMPOSABLE S-TETRAZINE BASED POLYMERS FOR SINGLE WALLED CARBON NANOTUBE APPLICATIONS

(71) Applicant: NATIONAL RESEARCH COUNCIL OF CANADA, Ottawa (CA)

(72) Inventors: Zhao Li, Orleans (CA); Jianfu Ding, Orleans (CA); Patrick Roland Lucien Malenfant, Orleans (CA)

(73) Assignee: National Research Council of Canada, Ottawa (CA)

(*) Notice: Subject to any disclaimer, the term of this patent is extended or adjusted under 35 U.S.C. 154(b) by 27 days.

(21) Appl. No.: 15/401,421

(22) Filed: Jan. 9, 2017

(65) Prior Publication Data

US 2018/0198065 A1   Jul. 12, 2018

(51) Int. Cl.
*H01L 51/00* (2006.01)
*H01L 51/05* (2006.01)
*C08G 61/12* (2006.01)

(52) U.S. Cl.
CPC ........ *H01L 51/0003* (2013.01); *C08G 61/126* (2013.01); *H01L 51/0048* (2013.01); *H01L 51/0558* (2013.01); *C08G 2261/124* (2013.01); *C08G 2261/1412* (2013.01); *C08G 2261/228* (2013.01); *C08G 2261/3221* (2013.01); *C08G 2261/3222* (2013.01); *C08G 2261/3243* (2013.01); *C08G 2261/3247* (2013.01); *C08G 2261/92* (2013.01)

(58) Field of Classification Search
CPC ............. H01L 51/0003; H01L 51/0048; H01L 51/0558; C08G 61/126; C08G 2261/124; C08G 2261/1412; C08G 2261/228; C08G 2261/3221; C08G 2261/3222; C08G 2261/3243; C08G 2261/3247; C08G 2261/92
See application file for complete search history.

(56) References Cited

U.S. PATENT DOCUMENTS

| 8,673,183 B2 | 3/2014 | Ding et al. |
| 2008/0287638 A1 | 11/2008 | Reynolds et al. |
| 2013/0253120 A1 | 9/2013 | Kulkarni et al. |

FOREIGN PATENT DOCUMENTS

| WO | 2015024115 A1 | 2/2015 |
| WO | WO 2015/024115 A1 | 2/2015 |

OTHER PUBLICATIONS

Hayden, et al., Chemical modification of multi-walled carbon nanotubes using a tetrazine derivative, Chemical Physics Letters 2007; 435: 84-89.*

Zhang et al, Reversible Dispersion and Release of Carbon Nanotubes Using Foldable Oligomers, American Chemical Society, 132, 2010, 10.1021/ja104105n, pp. 14113-14117.
Zhang et al, Separation and/or selective enrichment of single-walled carbon nanotubes based on their electronic properties, The Royal Society of Chemistry, Chem Soc Rev, 40, 2011, www.rsc.org/csr, pp. 1324-1336.
Zhang et al, The Road for Nanomaterials Industry: A Review of Carbon Nanotube Production, Post-Treatment, and Bulk Applications for Composites and Energy Storage, Small, 9, No. 8, 2013, wileyonlinelibrary.com , pp. 1237-1265.
Zheng et al, Enrichment of Single Chirality Carbon Nanotubes, Journal of American Chemical Society, vol. 129, No. 19, 2007, pp. 6084-6085.
Arnold et al, Sorting carbon nanotubes by electronic structure using density differentiation nature nanotechnology, vol. 1, Oct. 2006, doi:10.1038/nnano.2006.52, pp. 60-65.
Avouris, Molecular Electronics with Carbon Nanotubes, American Chemical Society, Accounts of Chemical Research I vol. 35, No. 12, 2002, pp. 1026-1034.
Brady et al, High performance transistors via aligned polyfluorene-sorted carbon nanotubes, American Institute of Physics, http://dx.doi.org/10.1063/1.4866577, Appl. Phys. Lett. 104, 083107, 2014, doi: 10.1063/1.4866577, pp. 083107-1-083107-5.
Broza, Georg, Synthesis, Properties, Functionalisation and Applications of Carbon Nanotubes: A State of the Art Review, Chemistry and Chemical Technology, vol. 4, No. 1, 2010, pp. 35-45.
Cao et al, Ultrathin Films of Single-Walled Carbon Nanotubes for Electronics and Sensors: A Review of Fundamental and Applied Aspects, Adv. Mater. 2009, 21, www.advmat.de, pp. 29-53.
Cao et al, Evaluation of Field-Effect Mobility and Contact Resistance of Transistors That Use Solution-Processed Single-Walled Carbon Nanotubes, ACSNANO, vol. 6, No. 7, 2012, www.acsnano.org, pp. 6471-6477.
Che et al, Review of carbon nanotube nanoelectronics and microelectronics, Semicond. Sci Technol. 29, 2014, 073001 (17pp), iopscience.iop.org, 132.246.65.94 , pp. 1-17.
De Volder et al, Carbon Nanotubes: Present and Future Commercial Applications, www.sciencemag.org, Science, vol. 339, 2013, , http://science.sciencemag.org/, pp. 535-539.
Ding et al, Synthesis, characterization and photovoltaic applications of a low band gap polymer based on s-tetrazine and dithienosilole, www.rsc.org/chemcomm, 2010, 46, http://pubs.rsc.org/en/Content/ArticleLanding/2010/CC/c0cc02766a#!divAbstract, pp. 8668-8670.
Ding et al, The Preparation of 3,6-Bis(3-hexylthien-2-yl)s-tetrazine and Its Conjugated Polymers, Wiley Online Library, wileyonlinelibrary.com/journal/jpola, 2011, pp. 3374-3386.
Ding et al, Enrichment of large-diameter semiconducting SWCNTs by polyfluorene extraction for high network density thin film transistors, The Royal Societyof Chemistry 2014, Nanoscale, 2014, 6, http://pubs.rsc.org/en/Content/ArticleLanding/2014/NR/c3nr05511f#!divAbstract, pp. 2328-2339.

(Continued)

*Primary Examiner* — Daniel McCracken
(74) *Attorney, Agent, or Firm* — Aventum IP Law LLP

(57) ABSTRACT

A process for purifying semiconducting single-walled carbon nanotubes (sc-SWCNTs) extracted with a conjugated polymer, the process comprising exchanging the conjugated polymer with an s-tetrazine based polymer in a processed sc-SWCNT dispersion that comprises the conjugated polymer associated with the sc-SWCNTs. The process can be used for production of thin film transistors. In addition, disclosed herein is use of an s-tetrazine based polymer for purification of semiconducting single-walled carbon nanotubes (sc-SWCNTs).

18 Claims, 6 Drawing Sheets

(56) References Cited

OTHER PUBLICATIONS

Franklin, Aaron D., The road to carbon nanotube transistors, Research News & Views, vol. 498, Nature, 2013, pp. 443-444.

Fujigaya et al, Non-covalent polymer wrapping of carbon nanotubes and the role of wrapped polymers as functional dispersants, IOP Publishing, National Institute for Materials Science, Sci. Technol. Adv. Mater. 16, 2015, 024802 (21pp), http://www.tandfonline.com/doi/full/10.1088/1468-6996/16/2/024802, pp. 1-21.

Geier et al, Controlled n-Type Doping of Carbon Nanotube Transistors by an Organorhodium Dimer, ACS Publications, Nano Letters, 2016 American Chemical Society, 2016, DOI:10.1021/acs.nanolett.6b01393, pp. 4329-4334.

Gomulya et al, Semiconducting Single-Walled Carbon Nanotubes on Demand by Polymer Wrapping, Advanced Materials, www.MaterialsViews.com, Adv. Mater. 2013, 25, 10.1021/cr9002962, pp. 2948-2956.

Hu et al, Carbon Nanotube Thin Films: Fabrication, Properties, and Applications, Chemical Reviews, 2010, vol. 110, No. 10, pp. 5790-5844.

WIPO, B82Y, http://web2.wipo.int/ipcpub, IPC, 2011, pp. 1-2.

Ji et al, Photodegrading hexaazapentacene dispersant for surface-clean semiconducting single-walled carbon nanotubes, Carbon 105, 2016, https://www.journals.elsevier.com/carbon, pp. 448-453.

Joo et al, Dose-Controlled, Floating Evaporative Self-assembly and Alignment of Semiconducting Carbon Nanotubes from Organic Solvents, dx.doi.org/10.1021/la500162x| Langmuir, 2014, 30, pp. 3460-3466.

Joo et al, Isolation of Pristine Electronics Grade Semiconducting Carbon Nanotubes by Switching the Rigidity of the Wrapping Polymer Backbone on Demand, ACS Nano, vol. 9, No. 10, 2015, www.acsnano.org, pp. 10203-10213.

Khripin et al, Spontaneous Partition of Carbon Nanotubes in Polymer-Modified Aqueous Phases, Journal of the American Chemical Society, dx.doi.org/10.1021/ja402762e, 2013, 135, pp. 6822-6825.

Lei et al, Removable and Recyclable Conjugated Polymers for Highly Selective and High-Yield Dispersion and Release of Low-Cost Carbon Nanotubes, Journal of the American Chemical Society, DOI:10.1021/jacs.5b12797, 2016, 138, pp. 802-805.

Lemasson et al, Debundling, selection and release of SWNTs using fluorene-based photocleavable polymers, Chem. Commun., 2011, 47, www.rsc.org/chemcomm, pp. 7428-7430.

Li et al, Bisfuran-S-Tetrazine-Based Conjugated Polymers: Synthesis, Characterization, and Photovoltaic Properties, Macromolecular Chemistry and Physics, 212, 2011, pubs.acs.org/cm, pp. 2260-2267.

Li et al, Alternating Copolymers of Dithienyl-s-Tetrazine and Cyclopentadithiophene for Organic Photovoltaic Applications, American Chemical Society, dx.doi.org/10.1021/cm200330c, 2011, 23, pp. 1977-1984.

Li et al, Development of a New s-Tetrazine-Based Copolymer for Efficient Solar Cells, American Chemical Society, vol. 132, No. 38, 2010, 10.1021/ja106052e , pp. 13160-13161.

Li et al, Surface effects on network formation of conjugated polymer wrapped semiconducting single walled carbon nanotubes and thin film transistor performance, Organic Electronics, 26, 2015, https://www.journals.elsevier.com/organic-electronics, pp. 15-19.

Li et al, Raman microscopy mapping for the purity assessment of chirality enriched carbon nanotube networks in thinfilm transistors, Nano Research , 2015, 8(7), DOI 10.1007/s12274-015-0725-y, pp. 2179-2187.

Llanes-Pallas et al, Modular Engineering of H-Bonded Supramolecular Polymers for Reversible Functionalization Carbon Nanotubes, Journal of the American Chemical Society, 133, 2011, pubs.acs.org/JACS, pp. 15412-15424.

Lobez et al, Radiation Detection: Resistivity Responses in Functional Poly(Olefin Sulfone)/Carbon Nanotube Composites, Angewandte Chemie Int. Ed., 49, 2010, DOI: 10.1002/anie.200904936, pp. 95-98.

Lu et al, Separated Metallic and Semiconducting Single-Walled Carbon Nanotubes: Opportunities in Transparent Electrodes and Beyond, American Chemical Society, Langmuir, 27, 2011, pubs.acs.org/Langmuir, pp. 4339-4350.

Van Noorden, Richard, The Trials of New Carbon, Nature, vol. 469, 2011, pp. 14-16.

Peng et al, Carbon nanotube electronics: recent advances, Elsevier Ltd., Materials Today, Vo. 17, No. 9, 2014, http://dx.doi.org/10.1016/j.mattod.2014.07.008, pp. 433-442.

Pochorovski et al, H-Bonded Supramolecular Polymer for the Selective Dispersion and Subsequent Release of Large-Diameter Semiconducting Single-Walled Carbon Nanotubes, American Chemical Society, 137, 2015, pubsl.acs.org/JACS, pp. 4328-4331.

Shea et al, Experimental Measurement of the Binding Configuration and Coverage of Chirality-Sorting Polyfluorenes on Carbon Nanotubes, The Journal of Physical Chemistry Letters, 5, 2014, pubs.acs.org/JPCL, pp. 3742-3749.

Stranks et al, Nanoengineering Coaxial Carbon Nanotube-Dual-Polymer Heterostructures, ACS Nano, vol. 6, No. 7, 2012, www.acsnano.org, pp. 6058-6066.

Stranks et al, Novel Carbon Nanotube-Conjugated Polymer Nanohybrids Prouduced by Multiple Polymer Processing, Materials Views, Advanced Materials, 25, 2013, www.advmat.de, pp. 4365-4371.

Stranks et al, Production of High-Purity Single-Chirality Carbon Nanotube Hybrids by Selective Polymer Exchange, Small, 9, No. 13, 2013, OI: 10.1002/smll.201202434 , pp. 2245-2249.

Sun et al, A Review of Carbon Nanotube- and Graphene-Based Flexible Thin-Film Transistors, Small, 9, No. 8, 2013, www.small-journal.com, pp. 1188-1205.

Takenobu et al, Stable and controlled amphoteric doping by encapsulation of organic molecules inside carbon nanotubes, Nature Materials, vol. 2, 2003, doi:10.1038/nmat976, pp. 683-688.

Toshimitsu et al, Semiconducting single-walled carbon nanotubes sorting with a removable solubilizer based on dynamic supramolecular coordination chemistry, Nature Communications, |5:5041|DOI: 10.1038/ncomms6041, 2014, pp. 1-9.

Toshimitsu et al, Facile Isolation of Adsorbent-Free Long and Highly-Pure ChiralitySelected Single Walled Carbon Nanotubes Using a Hydrogen-bonding Supramolecular Polymer, Scientific Reports | 5:18066 |DOI: 10.1038/srep18066, 2015, pp. 1-8.

Tulevski et al, Toward High-Performance Digital Logic Technology with Carbon Nanotubes, ACS Nano, vol. 8, No. 9, 2014, www.acsnano.org, pp. 8730-8745.

Umeyama et al, Dispersion of carbon nanotubes by photo- and thermal-responsive polymers containing azobenzene unit in the backbone, The Royal Society of Chemistry, 46, 2010, http://pubs.rsc.org/en/Journals/ArticleCollectionLanding?themeId=C003088K-E-C0CC02709J_THEME&e=1, pp. 5969-5971.

USPTO Class Schedule, Nanotechnology, 2013, pp. 1-7.

Wang et al, Degradable Conjugated Polymers: Synthesis and Applications in Enrichment of Semiconducting Single-Walled Carbon Nanotubes, Advanced Functional Materials, 21, 2011, wilelyonlinelibrary.com, pp. 1643-1651.

Wang et al, Carbon nanotube electronics—moving forward, Royal Society of Chemistry, 42, 2013, www.rsc.org/csr, pp. 2592-2609.

Wang et al, Conjugated polymer sorting of semiconducting carbon nanotubes and their electronic applications, Nano Today, 10, 2015, http://dx.doi.org/10.1016/j.nantod.2015.11.008, pp. 737-758.

Wu et al, Carbon Nanotubes for Thin Film Transistor: Fabrication, Properties, and Applications, Hindawi Publishing Corporation, Journal of Nanomaterials, vol. 2013, Article ID 627215, http://dx.doi.org/10.1155/2013/627215, pp. 1-16.

Kong, Jin et al—"Nanotube Molecular Wires as Chemical Sensors"; www.sciencemag.org, Science—Jan. 28, 2000 vol. 287, pp. 622-625.

* cited by examiner

DECOMPOSABLE S-TETRAZINE BASED POLYMERS FOR SINGLE WALLED CARBON NANOTUBE APPLICATIONS

TECHNICAL FIELD

The present application relates to carbon nanotubes. In particular, it relates to the use of s-tetrazine based polymers for single walled carbon nanotube applications.

BACKGROUND

As new emerging materials, single-walled carbon nanotubes (SWCNTs) have recently attracted extensive research interest due to their specific electrical, optical and mechanical properties. For different applications, the raw SWCNT materials have to be purified and enriched, as they contain metallic (m) and semiconducting (sc) single-walled carbon nanotubes, amorphous carbon, catalyst and other impurities. For example, sc-SWCNTs can be used as the active channel materials in field effect transistors (FET) in logic circuit and other electrical devices. Among various purification methods, comparatively, polymer extraction (PE) approach is a low cost and scalable process, and the sc-SWCNTs materials from this process also show quite high purity level.

Recently, conjugated polymer extraction (CPE) processes have been developed to purify single walled carbon nanotube (SWCNT) raw materials. Compared with other surfactant-based methods, such as density gradient ultra-centrifugation (DGU), gel chromatography and biphasic separation, CPE is simple, scalable and cost effective, thus possessing properties that are highly desirable for industrial applications. More importantly, the dispersed product is obtained as an organic solvent-based dispersion with relatively high tube content (e.g. up to ~20%-50%). This leads to additional benefits in the application of SWCNT materials in device fabrication and performance.

However, one of the problems associated with the CPE process lies in the difficulty to remove conjugated polymer that remains on the sc-SWCNTs after purification or device fabrication. In other methods, surfactants are used to disperse tubes in solution. While these small molecules have a weaker interaction with sc-SWCNTs and can be easily removed from the sc-SWCNT surface by a simple rinsing step, a large excess of surfactant is required, which is undesirable in many circumstances. One advantage of the CPE process is that relatively low weight ratio (e. g. polymer/tube weight ratio <2) of polymeric dispersant is needed to form a stable dispersion, especially when conjugated polymers are used and/or at high concentration, when compared to small molecule surfactants that are present at a weight percentage of 95% or more.

Conjugated polymers have much stronger adhesion interactions with sc-SWCNTs, and can helically wrapped around the sc-SWCNTs. Furthermore, in non-polar organic media, the π-π stacking interaction between the conjugated polymer and the sc-SWCNT surface can be stronger than that in polar solvents. Even after thorough solvent rinsing, however, the polymer content in the dispersion can still be over ~50% by weight.

One way to solve this problem is to use polymers with special chemical moieties that are introduced into the CPE process. These polymers can be metal-coordination polymers based on the interaction between ligand and metal ions, or H-bonded supramolecular polymers. These linkages can be easily broken by acid treatment such that the polymers will degrade into small units. Some polymers may contain degradable units, such as disilane, photocleavable o-nitrobenzylether and imine bonds. Other polymers may contain special units, such as azobenzene or foldable oligomers, so the conformation of these polymers can be changed by external stimuli, such as thermal isomerization or by using different solvents.

Although the aforementioned degradable polymers can be used for sc-SWCNT purification and/or dispersion, there are still some major drawbacks. For example, the polymer can only be partially removed after degradation; most of the degradations are carried out in solution; after polymer degradation, the sc-SWCNT will form bundles in solution which cannot be easily used for device fabrication; and none of the above polymer degradation was demonstrated on device surfaces after fabrication with the expectation that the sc-SWCNT would be likely removed from the surface.

Thus, there is a need for polymers that form stable sc-SWCNT dispersions, which can be easily removed from the sc-SWCNTs either in solution or post-device fabrication without removal of the sc-SWCNTs from the surface of the device.

The following documents (all of which are hereby incorporated by reference) disclose other classes of degradable and/or removable polymers for use in CPE processes for purifying CNT:

Pochorovski I, et al. *J. Am. Chem. Soc.* 2015, 137, 4328 4331.

Toshimitsu F, et al. *Nature Communications.* 5:5041, 9 pages.

Umeyama T, et al. *Chem. Commun.*, 2010, 46, 5969-5971.

Lei T, et al. *J. Am. Chem. Soc.* 2016, 138, 802 805.

Lemasson F, et al. *Chem. Commun.*, 2011, 47, 7428-7430.

Wang H, et al. *Nano Today*, (2015) 10, 737-758

A few of the polymers disclosed in these documents comprise heterocyclic N-containing rings, but none disclose tetrazine-based polymers.

In addition, US 2008/287638 and US 2013/0253120 (both of which are incorporated by reference) disclose classes of conjugated polymers that may contain a tetrazine group that associate with carbon nanotubes.

In particular, US 2013/0253120 discloses polyolefins, which may be tetrazine functionalized polyolefins, for modifying nanoparticles (including CNTs). However, this document does not disclose the class of s-tetrazine polymers for use in CPE extractions, nor does it disclose the degradability of these polymers.

US 2008/287638 discloses a class of "sticky" supramolecular polymers comprising a conjugated or electroactive segment (e.g. fluorenyl) and a "sticky" segment that non-covalently binds with the sidewall of the CNT, the sticky segment possibly comprising a tetrazine. However, this document does not disclose the particular class of s-tetrazine polymers, let alone any particular polymers comprising a tetrazine. Nor does it disclose the use of these polymers for purifying sc-SWCNTs in a CPE process. Furthermore, there is no discussion of the degradability of the polymers.

It is also known that tetrazines react with CNTs to form covalent bonds thereby breaking C=C bonds in the CNT framework. For example, Broza G. *Chemistry & Chemical Technology*, Vol. 4, No. 1 (2010), 35-45, discloses that tetrazines are known to form covalent bonds thereby breaking C=C bonds in the CNT framework.

U.S. Pat. No. 8,673,183; Li Z, et al. *J. Am. Chem. Soc.* 2010, 132, 13160-13161; and Li Z, et al. *Macromol. Chem. Phys.* 2011, 212, 2260 2267 (all of which are incorporated by reference), all disclose the class of s-tetrazine polymers for use in electronic devices, but not for use in association with carbon nanotubes (CNTs) and especially not for use in a CPE process to purify CNTs.

Although it is broadly disclosed that conjugated polymers that may contain a tetrazine group can associate with carbon nanotubes, it is also known that tetrazines can react with CNT to form covalent bonds, and none of the prior art contains examples of polymers containing a tetrazine group where the polymer associates with CNT.

Therefore it would not necessarily be expected that tetrazine polymers would associate with rather than react with CNT. In addition, there is no indication in the art that tetrazine-containing polymers would be useful in a CPE process for purifying CNTs, let alone the specific class of polymers of s-tetrazine polymers.

It has now been found that s-tetrazine based polymers can be used for sc-SWCNT purification, dispersion and device fabrication. Since s-tetrazine units can be easily decomposed by photo irradiation or thermal treatment, both in solution or on the device surface, the small molecules formed by decomposition can be washed away in solution or evaporated by laser irradiation or under vacuum in the solid state.

SUMMARY

Decomposable s-tetrazine based polymers for single walled carbon nanotube applications in their general forms will first be described, and then their implementation in terms of embodiments will be detailed hereafter. These embodiments are intended to demonstrate a process of purifying sc-SWONTs with s-tetrazine based polymers, use of s-tetrazine based polymers for purification of sc-SWONTs and a method for producing thin film transistors using s-tetrazine based polymers, and the manner of implementation. Decomposable s-tetrazine based polymers for single walled carbon nanotube applications will then be further described, and defined, in each of the individual claims which conclude this specification.

In one aspect of the present invention, there is provided a process for purifying semiconducting single-walled carbon nanotubes (sc-SWONTs) extracted with a conjugated polymer, the process comprising exchanging the conjugated polymer with an s-tetrazine based polymer in a processed sc-SWONT dispersion that comprises the conjugated polymer associated with the sc-SWONTs.

The above process may further comprise decomposing the s-tetrazine based polymer by photo irradiation or thermal treatment; followed by removal of the decomposition products. The decomposition products may be removed by rinsing or evaporation.

The s-tetrazine based polymer may have the following structure:

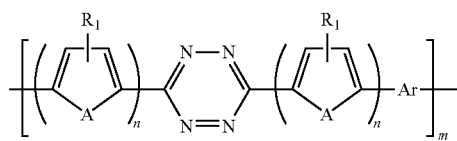

where A is O, S, Se or C≡C; n is an integer from 1 to 4; R1 is independently H, F, CN or a C1-C20 linear or branched aliphatic group; Ar is one or more substituted or unsubstituted aromatic units; and, m is an integer 5 or greater.

Examples of the s-tetrazine based polymer include (but are not limited to): PBDTFTz:

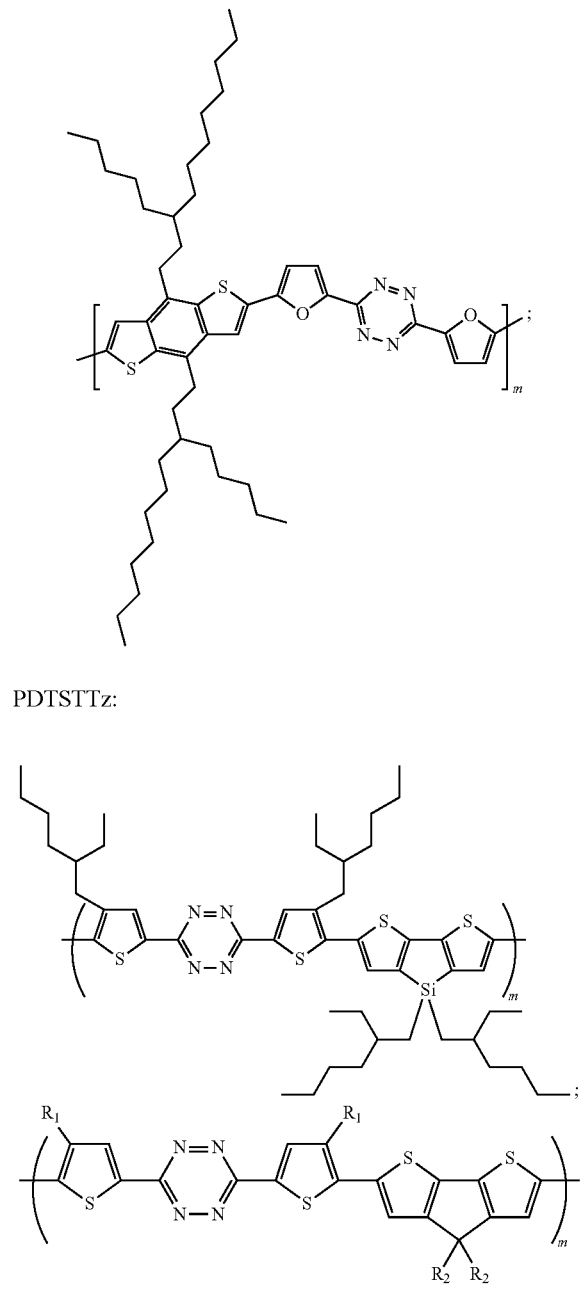

PDTSTTz:

where $R_1$ and $R_2$=2-ethylhexyl; or $R_1$=2-ethylhexyl and $R_2$=hexyl; or $R_1$=hexyl and $R_2$=2-ethylhexyl; or $R_1$ and $R_2$=hexyl; or $R_1$=methyl and $R_2$=2-ethylhexyl;

or PCPDTFTz:

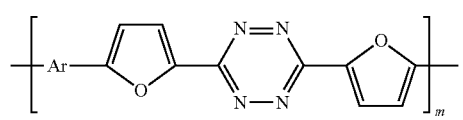

in which Ar=cyclopenta[2,1-b; 3.4-b']dithiophene.

The conjugated polymer may have a number average molecular weight greater than about 10,000 Da; or it may have number average molecular weight from 10,000 Da to 30,000 Da.

In addition, the conjugated polymer may comprise a polyfluorene or a polythiophene. In addition, the conjugated polymer may comprise a 3-alkyl-substituted polythiophene; a 9,9-diC10-36-alkyl-substituted polyfluorene; a 9,9-diC10-18-alkyl-substituted polyfluorene; a 3-C10-18-alkyl-substituted polythiophene; a copolymer of 9,9-diC10-18-alkyl-substituted fluorene with one or more co-monomer units, the co-monomer comprising one or more of thiophene, bithiophene, phenylene, bipyridine, carbazole, anthracene, naphthalene or benzothiadiazole; a copolymer of 3-C10-18-alkyl-substituted thiophene with one or more co-monomer units, the co-monomer comprising one or more of fluorene, bithiophene, phenylene, bipyridine, carbazole, anthracene, naphthalene or benzothiadiazole. An example of a conjugated polymer that may be used in the process is poly(9,9-di-n-dodecylfluorene) (PFDD).

In the process, the weight ratio of the conjugated polymer to the sc-SWCNTs can have a maximum value of 2, and may be in the range between 1 and 2. Furthermore, the weight ratio of the s-tetrazine based polymer to the sc-SWCNTs can have a maximum value of 6, or a maximum value of 4, and may be in the range between 1 and 4.

In a further aspect of the present invention, there is provided a use of an s-tetrazine based polymer for purification of semiconducting single-walled carbon nanotubes (sc-SWCNTs). The s-tetrazine based polymer can have the structure defined above, and may also include examples thereof as defined above. In addition, the aforementioned use can be used to produce thin film transistors.

In yet a further aspect of the present invention, there is provided a method for producing thin film transistors, the method comprising: a) exchanging a conjugated polymer with an s-tetrazine based polymer in a processed sc-SWCNT dispersion that comprises the conjugated polymer associated with the sc-SWCNTs, resulting in an associated complex of s-tetrazine/SWCNTs; b) removing the displaced conjugated polymer; c) applying the resulting dispersion to a substrate; d) applying heat and/or UV light to decompose the s-tetrazine based polymer; and e) removing the resulting decomposition products.

The s-tetrazine based polymer can have the structure defined above, and may also include examples thereof as defined above. Similarly, the conjugated polymer can have the number average molecular weight properties listed above, and may also include examples as defined above. In the method, the weight ratio of the conjugated polymer to the sc-SWCNTs can have a maximum value of 2, and may be in the range between 1 and 2. Furthermore, the weight ratio of the s-tetrazine based polymer to the sc-SWCNTs can have a maximum value of 6, or a maximum value of 4, and may be in the range between 1 and 4.

Wherever ranges of values are referenced within this specification, sub-ranges therein are intended to be included, unless otherwise indicated. Where characteristics are attributed to one or another variant of: the process of purifying sc-SWCNTs with s-tetrazine based polymers; the use of s-tetrazine based polymers for purification of sc-SWCNTs; and the method for producing thin film transistors using s-tetrazine based polymers, unless otherwise indicated, such characteristics are intended to apply to all other variants where such characteristics are appropriate or compatible with such other variants.

Further features will be described or will become apparent in the course of the following detailed description.

BRIEF DESCRIPTION OF DRAWINGS

For clearer understanding, preferred embodiments will now be described in detail by way of example, with reference to the accompanying drawings, in which.

DETAILED DESCRIPTION OF PREFERRED EMBODIMENTS

The following s-tetrazine based polymers can be used for SWCNT purification, dispersion and device fabrication:

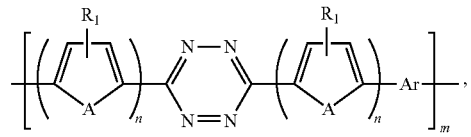

where each A is O, S, Se or C=C; each n is an integer from 1 to 4; each R1 is independently H, F, CN or a C1-C20 linear or branched aliphatic group; Ar is one or more substituted or unsubstituted aromatic units; and, m is an integer 5 or greater.

Examples of s-tetrazine based polymers include poly[2,6-(4,4'-bis(2-ethylhexyl)dithieno[3,2-b:2',3'-d]silole)-alt-5,5'-(3,6-bis[4-(2-ethylhexyl)thienyl-2-yl]-s-tetrazine)], also identified with the acronym PDTSTTz:

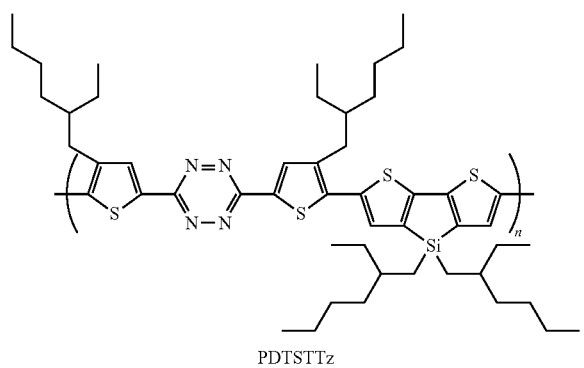

PDTSTTz

The synthesis, characterization and photovltaic applications of PDTSTTz are disclosed by J. Ding et al. in *Chem.*

*Commun.*, 2010, 45, 8668-8670, the contents of which are incorporated herein by reference.

Another class of s-tetrazine based polymers include the following five, which are disclosed by Z. Li et al. in *Chem. Mater.* 2011, 23, 1977-1984, the contents of which are incorporate herein by reference:

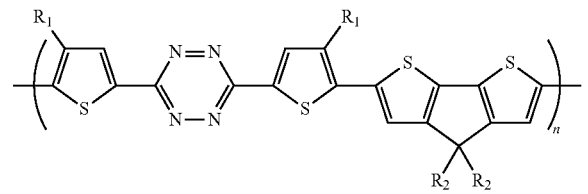

P1: $R_1$ = 2-ethylhexyl, $R_2$ = 2-ethylhexyl
P2: $R_1$ = 2-ethylhexyl, $R_2$ = hexyl
P3: $R_1$ = hexyl, $R_2$ = 2-ethylhexyl
P4: $R_1$ = hexyl, $R_2$ = hexyl
P5: $R_1$ = methyl, $R_2$ = 2-ethylhexyl In particular, P4, also known as PCPDTTTz, is used in the production of efficient solar cells, as disclosed by Z. Li et al. in *J. Am. Chem. Soc.*, 2010, 132, 13160-13161, the contents of which are incorporate herein by reference.

Another example includes PCPDTFTz, the synthesis, characterization and photovoltaic properties of which are disclosed by Z. Li et al. in *Macromol. Chem. Phys.* 2011, 212, 2260-2267, the contents of which are incorporate herein by reference:

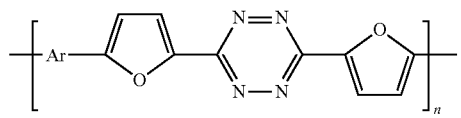

PCPDTFTz: Ar = cyclopenta[2,1-b; 3,4-b']dithiophene

In one embodiment, the following s-tetrazine based polymer (PBDTFTz), which contains alternating bisfuran-s-tetrazine and benzo [1,2-b:4,b-b']dithiophene units, can be used for SWCNT purification, dispersion and device fabrication:

Decomposition of S-Tetrazine Based Polymers

Differential scanning calorimetry (DSC) curves demonstrate that s-tetrazine polymer can be decomposed thermally at around 250° C.

Figure 1:
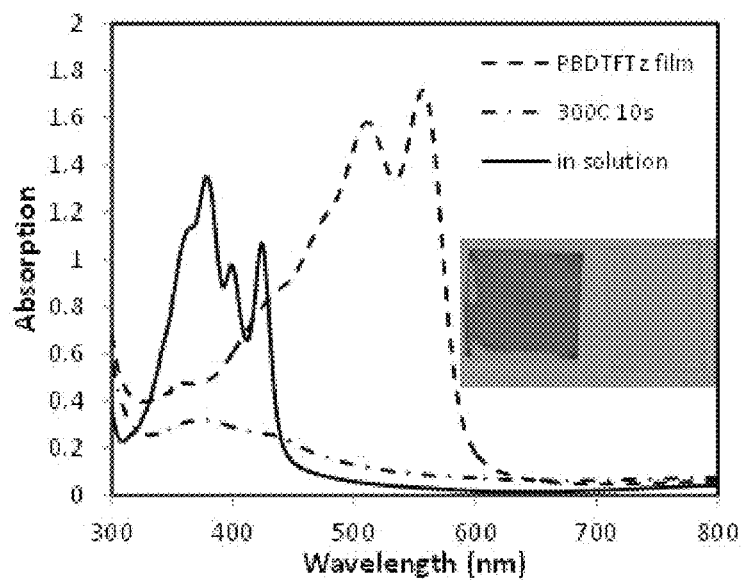
FIG. 1 illustrates UV absorption spectra of PBDTFTz film on glass slides before and after being heated at 300° C. for 10 s. Inset shows the pictures of the solution or film before (left) and after (right) decomposition.

This is illustrated in FIG. 1, in which a PBDTFTz film on a glass slide was heated at 300° C. for 10 s. The polymer PBDTFTz was synthesized as disclosed by Z. Li et al., *Macromol. Chem. Phys.*, 2011, 212, 2260. Broad UV absorption bands at 511 nm and 552 nm decrease with the appearance of new peaks around 380 nm, following thermal degradation. The solid line shows the UV spectra of the product after thermal decomposition in toluene solution. Inset shows the pictures of the solution or film before (left) and after (right) decomposition, in which the purple color of the initial polymer film/solution decays to yellow. GPC analysis of the decomposed product from thermal degradation confirms a dramatically decreased molecular weight.

The product contains 90% of dicyano compound (1): It has much shorter conjugation length than PBDTFTz so the absorption spectrum is blue shifted and contains well-resolved peaks. The decomposition scheme is shown as follows:

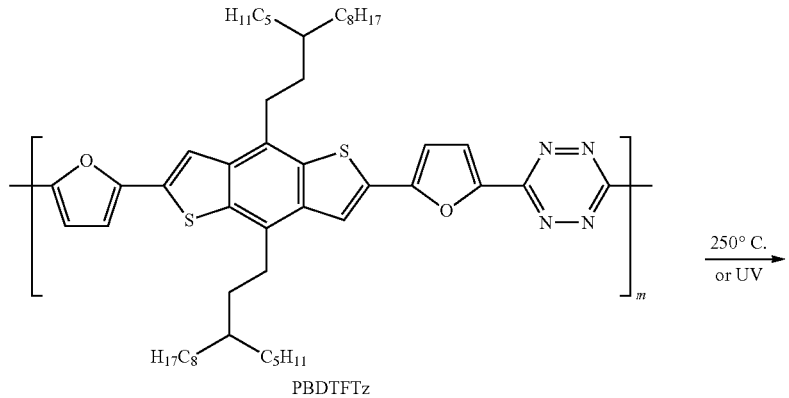

PBDTFTz

-continued

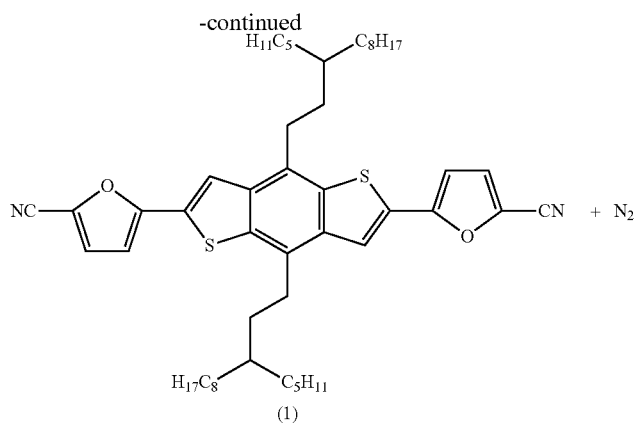

(1)

Figure 2:
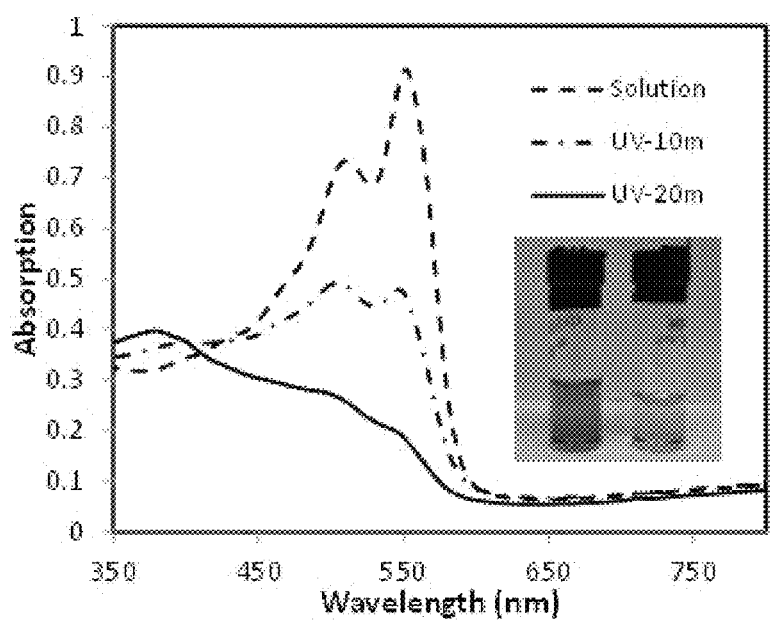
FIG. 2 illustrates UV absorption spectra of PBDTFTz in toluene solution before and after irradiated with UV light for 10 or 20 min.

Furthermore, s-tetrazine polymer is sensitive to strong UV light. This is illustrated in FIG. 2, in which the broad absorption bands at 511 nm and 552 nm decrease after a solution of PBDTFTz in toluene solution is irradiated with UV light for 10 or 20 min. As with thermal decomposition, the purple color of the initial polymer solution decays to yellow. GPC analysis of the decomposed product from photolytic degradation confirms that the degradation product is primarily 90% of dicyano compound (1) shown above.

Displacement of PFDD with S-Tetrazine Based Polymers

The interaction between s-tetrazine based polymers and SWCNT is quite strong, but not strong enough to disrupt the SWCNT structure. Other polymers, such as those of the polyfluorene class (PFDD), can be easily displaced by treating the PFDD dispersion with s-tetrazine polymer solution.

In one embodiment, a simple polymer exchange process can be used to replace poly(9,9-di-n-dodecylfluorene) (PFDD) on SWCNTs with PBDTFTz by a simple polymer exchange.

The polymer PBDTFTz was synthesized as disclosed in Z. Li et al., *Macromol. Chem. Phys.*, 2011, 212, 2260. High purity PFDD/sc-SWCNT solution was prepared as disclosed by Ding, Z et al. *Nanoscale*, 2014, 6, 2328, with a polymer/tube ratio of 1.3 and tube concentration at 165 mg/L. A PBDTFTz solution (1 g at 0.87 mg/mL) and toluene (3 g) was added to above solution (1 g), and the mixture was bath sonicated for 30 min. Then the solution was filtered on a Teflon membrane with pore size of 200 nm and washed with toluene (10 mL). The filter cake was then dispersed in toluene (4 g) and labeled as the product after first exchange. This process was repeated to obtain the product from a second polymer exchange. The polymer/tube ratio and solution concentration can be easily adjusted by filtration, dilution or addition of polymer. The final PBDTFTz/SWCNT dispersion has tube concentration at 25.5 mg/L and polymer/tube ratio at 4/1.

Figure 3:
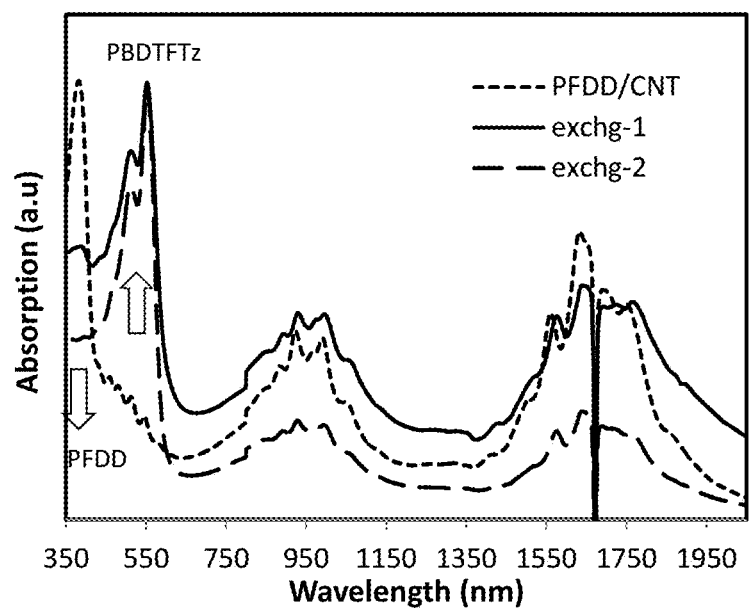
FIG. 3 illustrates UV absorption spectra of polymer/SWCNT dispersions in toluene of an original PFDD/SWCNT dispersion followed by polymer exchanges with PBDTFTz.

FIG. 3 illustrates a UV absorption spectra of the aforementioned polymer/SWCNT dispersions in toluene: original PFDD/SWCNT (dotted line), after 1st (solid line) and 2nd (dashed line) polymer exchange with PBDTFTz. In the first exchange, after bath sonication, filtration and rinsing, more than half of PFDD on the SWCNT surface was replaced by PBDTFTz. After the second ligand exchange, the PFDD peak at 380 nm in the UV spectra totally disappeared, indicating the complete replacement of PFDD by PBDTFTz, whose absorption peaks are located at 511 and 552 nm. In the meantime, the shape and resolution of S11 (1500 to 1900 nm) and S22 (700-1100 nm) bands of the SWCNTs stay untouched, indicating the formation of a stable PBDTFTz/SWCNT dispersion. It was also found that the ratio of PBDTFTz/SWCNT can be reduced to ~2.6/1 in the dispersion even after thorough dilution and rinsing step, agreeing well with the stronger interaction of PBDTFTz with SWCNTs than that of PFDD, whose ratio to SWCNT can be reduced to ~1.2/1 under similar condition.

Clean SWCNT Networks

As discussed above, s-tetrazine based polymers can be decomposed by photo irradiation or heating. After decomposition, the resulting small molecules can be washed away in solution or evaporated under laser irradiation or heating under vacuum if it is in the solid state. In this manner, clean SWCNT networks can be obtained, which is desirable for electrical devices application, such as thin film transistors (TFTs) or sensors. This is discussed further below in reference to FIG. 4.

Use of PBDTFTz/SWCNT Dispersions for Preparation of TFT

PBDTFTz/SWCNT dispersions can be used to prepare electronic devices.

Figure 4:
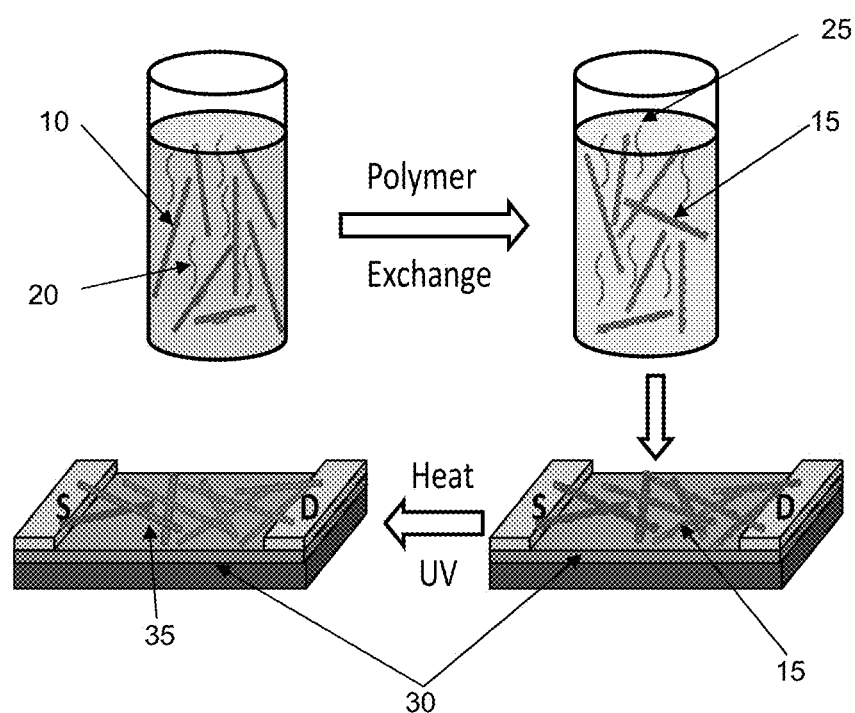
FIG. 4 illustrates the application of decomposable s-tetrazine based polymer for preparation of SWCNT thin film transistors with enhanced contact.

The use of decomposable s-tetrazine based polymer for producing SWCNT thin film transistors with enhanced contact, is summarized in FIG. 4. A dispersion of PFDD (20) and PFDD/SWCNT (10) undergoes a polymer exchange in which an s-tetrazine based polymer (25) displaces the PFDD, resulting in an associated complex of s-tetrazine/SWCNTs (15). Once the PFDD (20) is removed, the resulting dispersion is then applied to a substrate (30). Following the application of heat and/or UV light, the s-tetrazine based polymer decomposes, with the resulting decomposition products removed, leaving behind clean SWCNT networks (35).

In-situ transistor characterization under laser reveals the decomposition of PBDTFTz and evaporation of the small molecule compounds formed. Further investigation of the resistance from different channel length devices demonstrates dramatically improved contact between tubes due to removal of wrapping polymers. This fully exposed tube network can be particularly attractive for sensor applications, and results in improved contact.

TFT devices were fabricated using prefabricated devices with a 230 nm thick thermal oxide layer. The chip has pre-patterned Au electrodes with 4×4 TFT devices at channel lengths of 20, 10, 5, 2.5 µm and a channel width of 2,000 µm respectively. The chip was soaked in a 5% Hellmanex solution for 20 min at 60° C. before rinsed with water and isopropanol, blow-dried with nitrogen. The polymer/tube dispersion (0.1 mL) was then spread on the chip surface and the chip was soaked for 10 min under toluene vapor. The chip was then rinsed with toluene (5 mL) and blow dried with nitrogen before annealed at 140° C. for 10 min in air.

As an example, the PBDTFTz/SWCNT dispersion prepared above was used to prepare thin film transistors (TFT) on a freshly cleaned and pre-patterned $SiO_2$ substrate according to a procedure disclosed by Z. Li, J. Ding et al., in Org. Electron. 2015, 26, 15. The resulting TFT devices have a bottom contact and common bottom gate configuration. For comparison, devices prepared from a PFDD/SWCNT dispersion were also fabricated at the same concentration and polymer/tube ratio.

Figure 5:
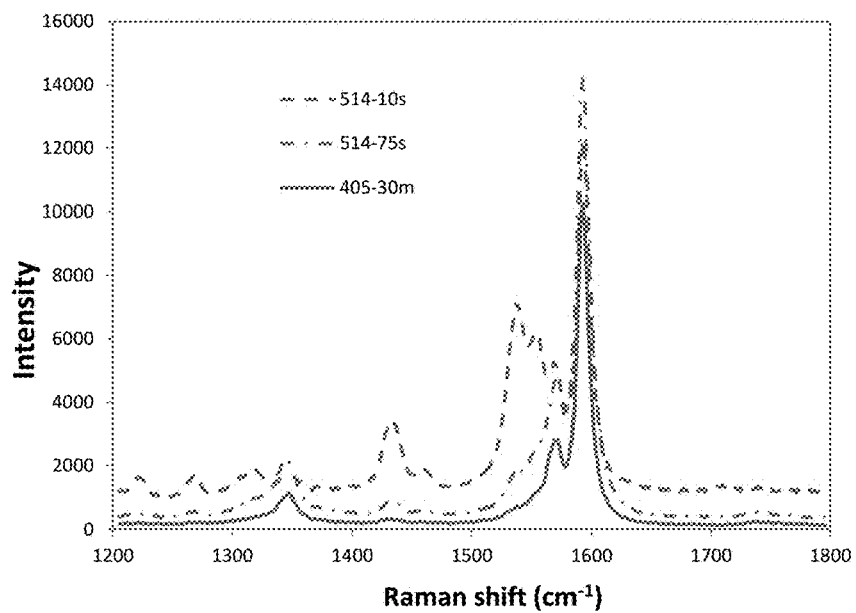
FIG. 5 illustrates Raman spectra of a PBDTFTz/SWCNT film on a silicon substrate during laser irradiation.

The degradation of the PBDTFTz on the SWCNT network was monitored by resonance Raman spectroscopy as shown in FIG. 5. Under 514 nm laser irradiation, the intensities of Raman shift at 1430 and 1530 $cm^{-1}$ from PBDTFTz gradually decreased, while the D and G bands from SWCNTs began to dominate. After 30 minutes exposure of the network to a 405 nm laser, all of the signals from PBDTFTz disappeared and only a clean spectrum of the SWCNTs remained.

Figure 6:
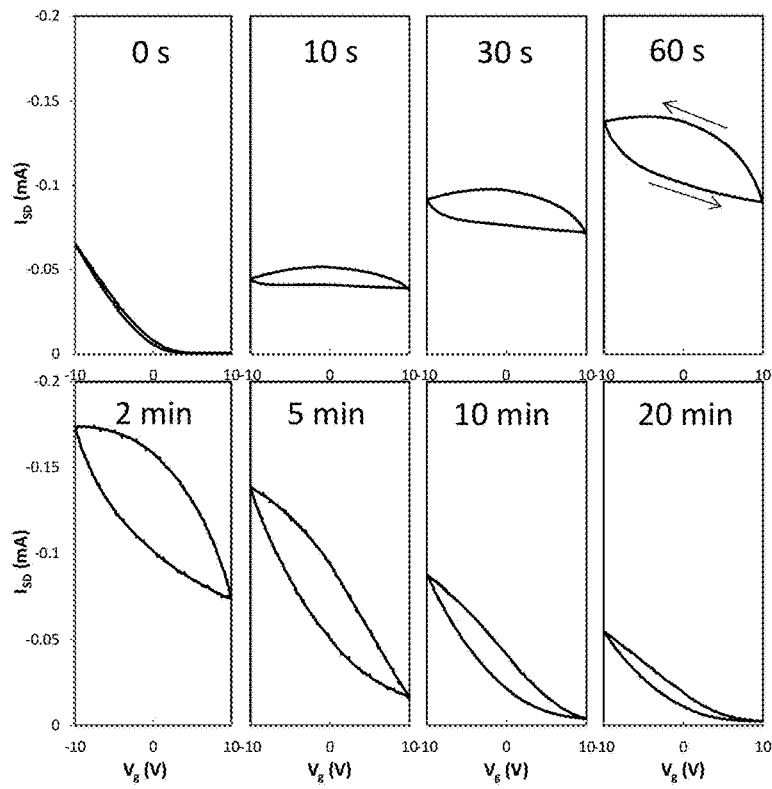
FIG. 6 illustrates the transfer curve of TFTs from a PBDTFTz/SWCNT dispersion at different irradiation time under 405 nm laser.

The TFT transistor was also characterized simultaneously under 405 nm laser irradiation. FIG. 6 illustrates the transfer curve of TFTs from a PBDTFTz/SWCNT dispersion at different irradiation time under 405 nm laser. $V_{SD}=1V$ and active channel length and width are 20 and 2000 μm respectively. Arrows show the sweeping direction.

In the first 2 min, the on-current (at $V_g=-10V$) of the TFT increased gradually from 70 to 170 μA while the off-current at $V_g=10V$ increased more dramatically by several orders of magnitude, which resulted to very poor on/off ratio. The hysteresis of the transfer curve also became more severe. However, this change reached plateau at 2 min and then slowly moved back.

This phenomenon can be explained by the degradation of PBDTFTz. Under 405 nm laser irradiation, PBDTFTz begins to decompose with the formation of dicyano (compound (1)) and release of nitrogen gas according to the decomposition scheme above. Compound (1) contains two cyano groups in each molecule and is a very strong p-doping agent for SWCNT. During PBDTFTz degradation, compound (1) that is formed will adhere on tubes first, and this will cause more p-doping effect (in addition to oxygen from the air) and shift the threshold voltage towards a positive direction. Longer time laser irradiation will further evaporate compound (1) that is formed and this p-doping effect will then alleviate.

Since the resulting TFTs always show a low on/off ratio, this suggests that compound (1) may not be completely removed from tube surface by simple laser irradiation. However, this decomposition reaction can be accelerated at a higher temperature; compound (1) can be completely removed at 300° C. under vacuum. The TFTs from PFDD/SWCNT was also characterized under laser irradiation, only slightly decreasing of on-current was observed, which can be attributed to the decreased p-doping of $O_2$ under laser light as all measurements were carried out in ambient conditions.

Comparison of Networks Based on PFDD/SWCNT and PBDTFTz/SWCNT

Figure 7A:
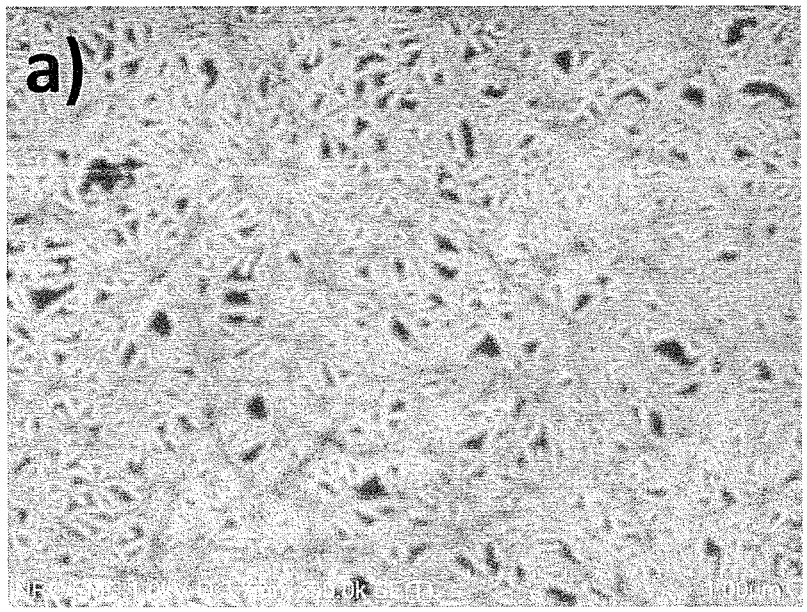
FIGS. 7a and 7b are SEM images of the tube network on SiO$_2$ substrate prepared from polymer (a) PBDTFTz/SWCNT and (b) PFDD/SWCNT dispersion.
Figure 7B:
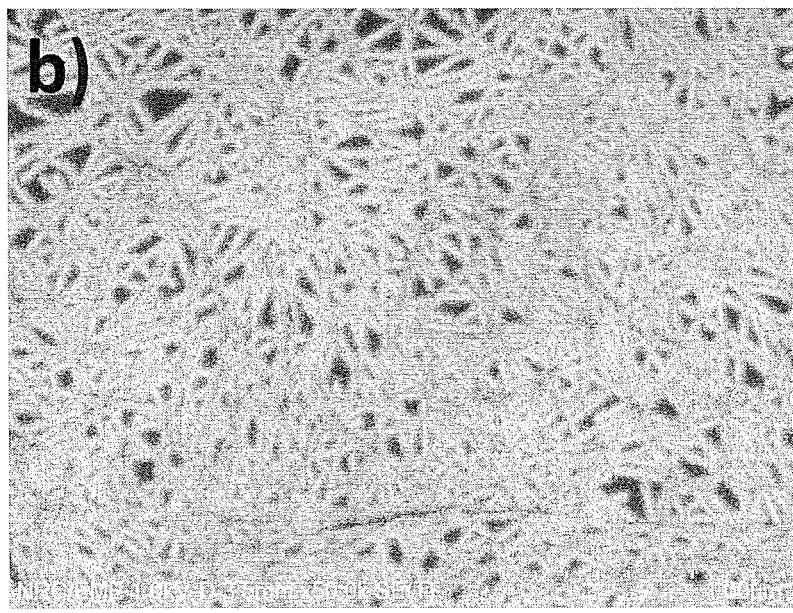
Figure 8A:
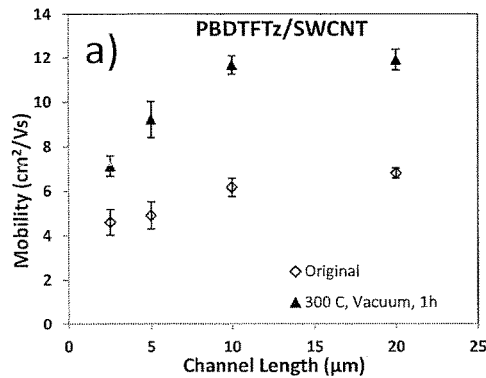
FIGS. 8a-8f illustrate a comparison of properties at various channel lengths, between TFTs prepared with PBDTFTz/SWCNT (a, c and, e) or PFDD/SWCNT (b, d and f) dispersions.
Figure 8B:
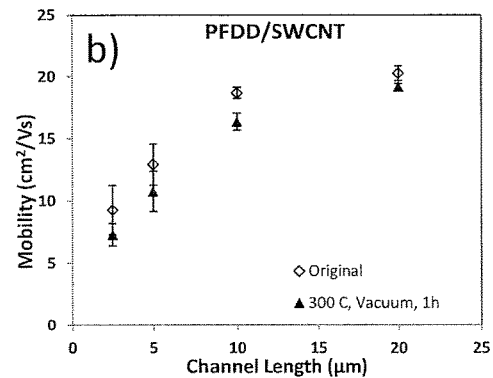
Figure 8C:
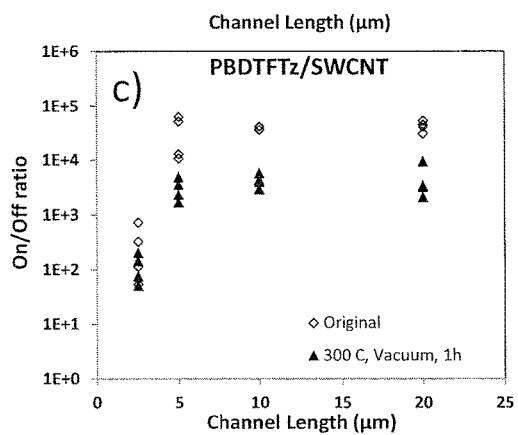
Figure 8D:
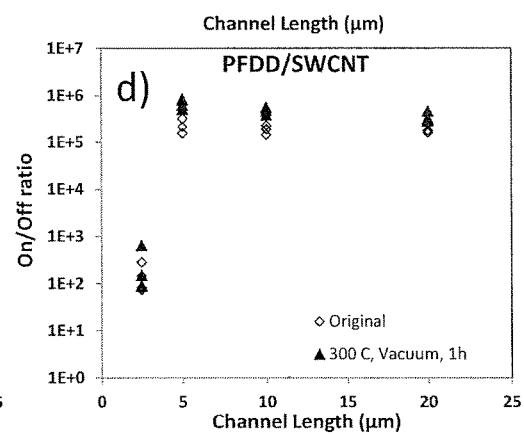
Figure 8E:
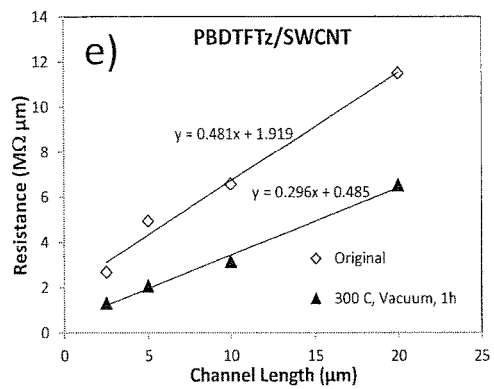
Figure 8F:
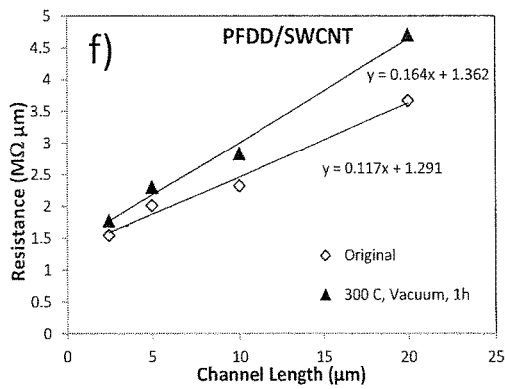

In general, the TFTs from PFDD/SWCNT have higher current and mobility, although their SEM images show quite similar tube density to those of PBDTFTz/SWCNT (see FIGS. 7a and 7b). The weight ratio of polymer/SWCNT is 4:1, while the concentration of SWCNT is 25.5 mg/L. The scale bar on the right bottom corner of the image is 1 μm.

Further examination reveals a higher degree of bundles and curved tube conformation in the PBDTFTz/SWCNT network, which may limit the contact between tubes.

FIGS. 8a-8f illustrate a comparison of properties at various channel lengths, between TFTs prepared with PBDTFTz/SWCNT (a, c and, e) or PFDD/SWCNT (b, d and f) dispersions. In particular, FIGS. 8(a) and (b) measure mobility; 8(c) and (d) measure On/off ratio; and 8(e) and (f) measure resistance of TFTs prepared from PBDTFTz/SWCNT (a, c, e) or PFDD/SWCNT (b, d, f) dispersions at various channel length. The channel width is 2,000 μm. Polymer/tube weight ratios are 4/1 and concentration of SWCNT is 25.5 mg/L.

More detailed characterization of the TFTs with different channel length from PBDTFTz/SWCNT before, and after, decomposition is shown in FIG. 8. For PBDTFTz/SWCNT TFTs, after removal of PBDTFTz, the mobility almost doubled due to better contact between tubes, whereas the mobility from PFDD/SWCNT slightly decreased due to decreased p-doping level (from $O_2$ and moisture) after heating and vacuum treatment. The on/off ratio of PBDTFTz/SWCNT TFTs decreased slightly after decomposition due to the raised off-current. The sheet resistance ($R_\square$) and contact resistance ($R_c$) could be extracted from the data of the devices with various channel length.

For PBDTFTz/SWCNT TFTs, after degradation, $R_\square$ decreased from 0.481 to 0.296 MΩ while $R_c$ decreased more dramatically from 0.960 to 0.242 KΩ μm. It is interesting that the removal of insulating polymer layer on tubes has more effect on $R_c$ than $R_\square$. This also demonstrates the significance of removal of the insulation polymer layer on the tube surface within a network.

For PFDD/SWCNT TFTs, after similar treatment, on the contrary, $R_\square$ increased from 0.117 to 0.164 MΩ, while $R_c$ remained almost unchanged, which can be attributed to decreased p-doping level after vacuum and thermal treatment.

The complete and easy removal of dispersant from the tube surface not only improves the device performance of transistors, but also benefits the sensitivity of the devices. This kind of wholly exposed tube surfaces is highly desired for sensor applications.

In the aforementioned TFT device characterization: I-V curves were collected on a probe station at ambient condition and the mobility was calculated from the $I_{sd}$-$V_g$ transfer curve in the linear regime based on a parallel plate model. Due to high channel width/length ratio (≥100), the contribution arising from tubes outside the defined channel area can be ignored. For TFT testing under laser irradiation, a 405 nm LDCU laser control unit was used and the laser beam was reflected onto the active channel as shown in FIG. 5. Raman spectra were acquired with an InVia Raman microscope (Renishaw) on finished devices, using 514 nm laser excitation source and 100 magnification objective lens. SEM images were obtained using Hitachi SU-5000 operated at 1 kV (charge contrast imaging mode on $SiO_2$/Si substrate). UV absorption spectra were collected on a UV-Vis NIR spectrophotometer (Cary 5000, Varian) over a wavelength range from 300 to 2100 nm.

REFERENCES

The contents of the entirety of each of which are incorporated by this reference:

P. Avouris, Acc. Chem. Res. 2002, 35, 1026.
Q. Cao, J. A. Rogers, Adv. Mater. 2009, 21, 29;
L. Hu, D. S. Hecht, G. Grüner, Chem. Rev. 2010, 110, 5790.
R. V. Noorden, Nature 2011, 469, 14.
C. Wang, K. Takei, T. Takahashi, A. Javey, Chem. Soc. Rev. 2013, 42, 2592.

M. F. L. De Voider, S. H. Tawfick, R. H. Baughman, A. J. Hart, *Science* 2013, 339, 535.

Q. Zhang, J.-Q. Huang, W.-Z. Qian, Y.-Y. Zhang, F. Wei, *Small* 2013, 9, 1237.

L.-M. Peng, Z. Zhang, S. Wang, *Mater. Today*, 2014, 17, 434.

H. Zhang, B. Wu, W. Hu, Y. Liu, *Chem. Soc. Rev.*, 2011, 40, 1324.

F. Lu, M. J. Meziani, L. Cao, Y.-P. Sun, *Langmuir* 2011, 27, 4339.

Y. Wu, X. Lin, M. Zhang, J. *Nanomaterials*, 2013, 627215.

A. D. Franklin, *Nature*, 498, 443.

D.-M. Sun, C. Liu, W. C. Ren, H.-M. Cheng, *Small* 2013, 9, 1188.

Y. Che, H. Chen, H. Gui, J. Liu, B. Liu, C. Zhou, *Semicond. Sci. Technol.* 2014, 29, 073001.

G. S. Tulevski, A. D. Franklin, D. Frank, J. M. Lobez, Q. Cao, H. Park, A. Afzali, S.-J. Han, J. B. Hannon, W. Haensch, *ACS Nano*, 2014, 8, 8730.

T. Fujigaya, N. Nakashima, *Sci. Technol. Adv. Mater.* 2015, 16, 024802.

H, Wang, Z. Bao, *Nano Today*, 2015, 10, 737.

Z. Li, J. Ding, P. Finnie, J. Lefebvre, F. Cheng, C. T. Kingston, P. R. L. Malenfant, *Nano Res.* 2015, 8, 2179.

G. J. Brady, Y. Joo, S. S. Roy, P. Gopalan, M. S. Arnold, *Appl. Phys. Lett.* 2014, 104, 083107.

Z. Li, J. Ding, J. Lefebvre, P. R. L. Malenfant, *Org. Electron.* 2015, 26, 15.

F. Lemasson, J. Tittmann, F. Hennrich, N. Sturzl, S. Malik, M. M. Kappes, M. Mayor, *Chem. Commun.* 2011, 47, 7428.

T. Umeyama, K. Kawabata, N. Tezuka, Y. Matano, Y. Miyato, K. Matsushige, M. Tsujimoto, S. Isoda, M. Takano, H. Imahori, *Chem. Commun.*, 2010, 46, 5969.

Z. Zhang, Y. Che, R. A. Smaldone, M. Xu, B. R. Bunes, J. S. Moore, L. Zang, *J. Am. Chem. Soc.* 2010, 132, 14113.

W. Z. Wang, W. F. Li, X. Y. Pan, C. M. Li, L.-J. Li, Y. G. Mu, J. A. Rogers, M. B. Chan-Park, *Adv. Funct. Mater.* 2011, 21, 1643.

Q. Ji, J. Han, X. Yu, S. Qiu, H. Jin, D. Zhang, Q. Li, *Carbon*, 2016, 105, 448.

I. Pochorovski, H. Wang, J. I. Feldblyum, X. Zhang, A. L. Antaris, Z. Bao, *J. Am. Chem. Soc.* 2015, 137, 4328.

F. Toshimitsu, N. Nakashima, *Sci. Rep.* 2015, 5, 18066, doi: 10.1038/srep18066.

A. Llanes-Pallas, K. Yoosaf, H. Traboulsi, J. Mohanraj, T. Seldrum, J. Dumont, A. Minoia, R. Lazzaroni, N. Armaroli, D. Bonifazi, *J. Am. Chem. Soc.* 2011, 133, 15412.

T. Lei, X. Chen, G. Pitner, H.-S. P. Wong, Z. Bao, *J. Am. Chem. Soc.* 2016, 138, 802.

F. Toshimitsu, N. Nakashima, *Nat. Commun.* 2014, 5:5041, doi: 10.1038/ncomms6041.

Y. Joo, G. J. Brady, M. J. Shea, M. B. Oviedo, C. Kanimozhi, S. K. Schmitt, B. M. Wong, M. S. Arnold, P. Gopalan, *ACS Nano* 2015, 9, 10203.

Z. Li, J. Ding, *Macromol. Chem. Phys.* 2011, 212, 2260.

Z. Li, J. Ding, N. Song, J. Lu, Y. Tao, *J. Am. Chem. Soc.* 2010, 132, 13160.

Z. Li, J. Ding, N. Song, X. Du, J. Zhou, J. Lu, Y. Tao, *Chem. Mater.* 2011, 23, 1977.

W. Gomulya, G. D. Costanzo, E. J. F. de Carvalho, S. Z. Bisri, V. Derenskyi, M. Fritsch, N. Fröhlich, S. Allard, P. Gordiichuk, A. Herrmann, S. J. Marrink, M. C. dos Santos, U. Scharf, M. A. Loi, *Adv. Mater.* 2013, 25, 2948.

J. Ding, Z. Li, J. Lefebvre, F. Cheng, G. Dubey, S. Zou, P. Finnie, A. Hrdina, L. Scoles, G. P. Lopinski, C. T. Kinsgton, B. Simard, P. R. L. Malenfant, *Nanoscale*, 2014, 6, 2328.

http://raymor.com/our-products/isosol-s100/, accessed: August, 2016.

S. D. Stranks, C.-K. Yong, J. A. Alexander-Webber, C. Weisspfennig, M. B. Johnston, L. M. Herz, R. J. Nicholas, *ACS Nano* 2012, 6, 6058.

S. D. Stranks, S. N. Habisreutinger, B. Dirks, R. J. Nicholas, *Adv. Mater.* 2013, 25, 4365.

S. D. Stranks, A. M. R. Baker, J. A. Alexander-Webber, B. Dirks, R. J. Nicholas. *Small*, 2013, 9, 2245.

T. Takenobu, T. Takano, M. Shiraishi, Y. Murakami, M. Ata, H. Kataura, Y. Achiba, Y. Iwasa, *Nat. Mater.* 2003, 2, 683.

Y. Joo, G. J. Brady, M. S. Arnold, R. Gopalan, Langmuir 2014, 30, 3460; b) M. L. Geier, K. Moudgil, S. Barlow, S. R. Marder, M. C. Hersam, *Nano Lett.* 2016, 16, 4329.

M. J. Shea, R. D. Mehlenbacher, M. T. Zanni, M. S. Arnold, *J. Phys. Chem. Lett.* 2014, 5, 3742.

Q. Cao, S.-J. Han, G. S. Tulevski, A. D. Franklin, W. Haensch, *ACS Nano* 2012, 6, 6471.

J. M. Lobez, T. M. Swager, Angew. *Chem. Int. Ed.* 2010, 49, 95.

The novel features will become apparent to those of skill in the art upon examination of the description. It should be understood, however, that the scope of the claims should not be limited by the embodiments, but should be given the broadest interpretation consistent with the wording of the claims and the specification as a whole.

The invention claimed is:

1. A process for purifying semiconducting single-walled carbon nanotubes (sc-SWCNTs) extracted with a conjugated polymer, the process comprising exchanging the conjugated polymer with an s-tetrazine based polymer in a processed sc-SWCNT dispersion that comprises the conjugated polymer associated with the sc-SWCNTs.

2. The process of claim 1, further comprising decomposing the s-tetrazine based polymer by photo irradiation or thermal treatment; followed by removal of the decomposition products.

3. The process of claim 1, wherein the s-tetrazine based polymer has the following structure:

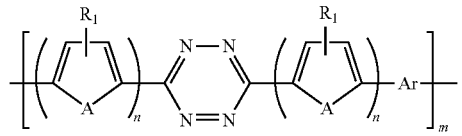

where A is O, S, Se or C=C; n is an integer from 1 to 4; $R_1$ is independently H, F, CN or a $C_1$-$C_{20}$ linear or branched aliphatic group; Ar is one or more substituted or unsubstituted aromatic units; and, m is an integer 5 or greater.

4. The process of claim 1, wherein the s-tetrazine based polymer is PBDTFTz:

5. The process of claim 1, wherein the s-tetrazine based polymer is PDTSTTz:

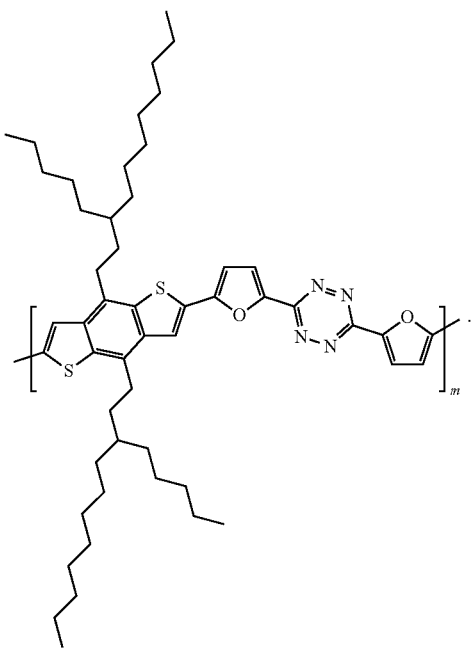

6. The process of claim 1, wherein the s-tetrazine based polymer is:

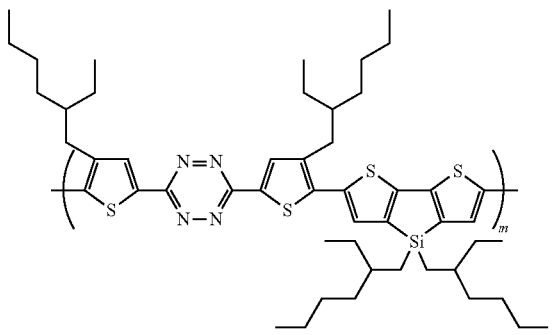

and wherein: $R_1$ and $R_2$=2-ethylhexyl; or $R_1$=2-ethylhexyl and $R_2$=hexyl; or $R_1$=hexyl and $R_2$=2-ethylhexyl; or $R_1$ and $R_2$=hexyl; or $R_1$=methyl and $R_2$=2-ethylhexyl.

7. The process of claim 1, wherein the s-tetrazine based polymer is PCPDTFTz:

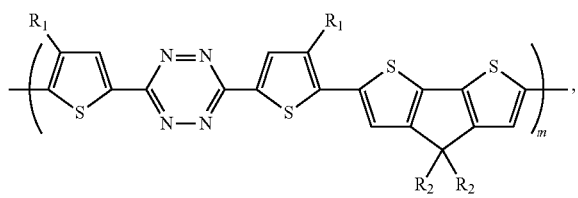

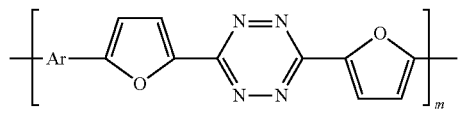

in which Ar=cyclopenta[2,1-b; 3.4-b']dithiophene.

8. The process of claim 2, wherein the decomposition products are removed by rinsing or evaporation.

9. The process of claim 1, wherein the conjugated polymer comprises a polyfluorene.

10. The process of claim 1, wherein the conjugated polymer comprises a polythiophene.

11. The process according to claim 1, wherein the conjugated polymer is poly(9,9-di-n-dodecylfluorene) (PFDD).

12. The process according to claim 1, wherein the weight ratio of the conjugated polymer to the sc-SWCNTs has a maximum value of 2.

13. The process according to claim 1, wherein the weight ratio of the s-tetrazine based polymer to the sc-SWCNTs has a maximum value of 4.

14. The process according to claim 1, wherein the weight ratio of the s-tetrazine based polymer to the sc-SWCNTs is between 1 and 4.

15. A method for producing thin film transistors, the method comprising:
 a) exchanging a conjugated polymer with an s-tetrazine based polymer in a processed sc-SWCNT dispersion that comprises the conjugated polymer associated with the sc-SWCNTs, resulting in an associated complex of s-tetrazine/SWCNTs (15);
 b) removing the displaced conjugated polymer;
 c) applying the resulting dispersion to a substrate;
 d) applying heat and/or UV light to decompose the s-tetrazine based polymer; and
 e) removing the resulting decomposition products.

16. The method according to claim 15, wherein the s-tetrazine based polymer has the following structure:

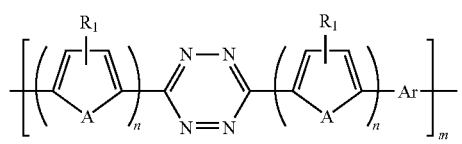

where A is O, S, Se or C═C; n is an integer from 1 to 4; $R_1$ is independently H, F, CN or a $C_1$-$C_{20}$ linear or branched aliphatic group; Ar is one or more substituted or unsubstituted aromatic units; and, m is an integer 5 or greater.

17. The method of claim 16, wherein the wherein the s-tetrazine based polymer is PBDTFTz:

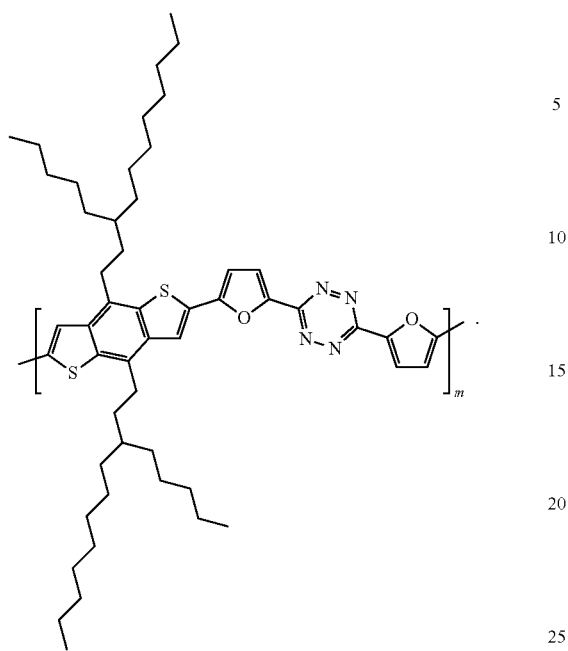
18. The method of claim 16 wherein the conjugated polymer is poly(9,9-di-n-dodecylfluorene) (PFDD).
* * * * *